United States Patent
Kaida et al.

(10) Patent No.: US 9,316,771 B2
(45) Date of Patent: Apr. 19, 2016

(54) ETCHING PROCESS, METHOD OF MANUFACTURING ELECTRONIC DEVICE, AND METHOD OF MANUFACTURING POLARIZING PLATE

(71) Applicant: Sony Corporation, Tokyo (JP)

(72) Inventors: Masahiro Kaida, Kumamoto (JP); Yuu Kawaguchi, Kumamoto (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/456,944

(22) Filed: Aug. 11, 2014

(65) Prior Publication Data

US 2015/0060396 A1 Mar. 5, 2015

(30) Foreign Application Priority Data

Aug. 28, 2013 (JP) ................................ 2013-176347

(51) Int. Cl.
| | | |
|---|---|---|
| *H01B 13/00* | (2006.01) | |
| *G02B 5/30* | (2006.01) | |
| *C23F 4/00* | (2006.01) | |
| *H05K 3/06* | (2006.01) | |

(52) U.S. Cl.
CPC ................ *G02B 5/3025* (2013.01); *C23F 4/00* (2013.01); *G02B 5/3058* (2013.01); *H05K 3/061* (2013.01); *H05K 2203/058* (2013.01)

(58) Field of Classification Search
CPC ...... C23F 4/00; G02B 5/3025; G02B 5/3058; H05K 3/00
USPC ........ 216/13, 37, 67; 438/637, 669, 695, 706, 438/712, 733; 349/5, 8, 96, 99
See application file for complete search history.

(56) References Cited

U.S. PATENT DOCUMENTS

| | | | | |
|---|---|---|---|---|
| 4,403,151 | A * | 9/1983 | Mochiji et al. ............. | 250/492.2 |
| 6,383,942 | B1 * | 5/2002 | Narita ............... | H01L 21/32136 216/67 |
| 8,445,184 | B2 * | 5/2013 | Matsuda ............. | H01L 21/0273 430/311 |
| 8,467,017 | B2 * | 6/2013 | Kumai ........................... | 349/96 |

FOREIGN PATENT DOCUMENTS

JP 2009-188224 A 8/2009

* cited by examiner

*Primary Examiner* — Duy Deo
*Assistant Examiner* — Maki Angadi
(74) *Attorney, Agent, or Firm* — Wolf, Greenfield & Sacks, P.C.

(57) ABSTRACT

An etching process includes: forming a metal film on a substrate having a pattern formation region; forming a mask having a predetermined pattern on the metal film in the pattern formation region, and forming a resist film in part or all of a periphery of the pattern formation region; and dry-etching the metal film in the pattern formation region.

15 Claims, 16 Drawing Sheets

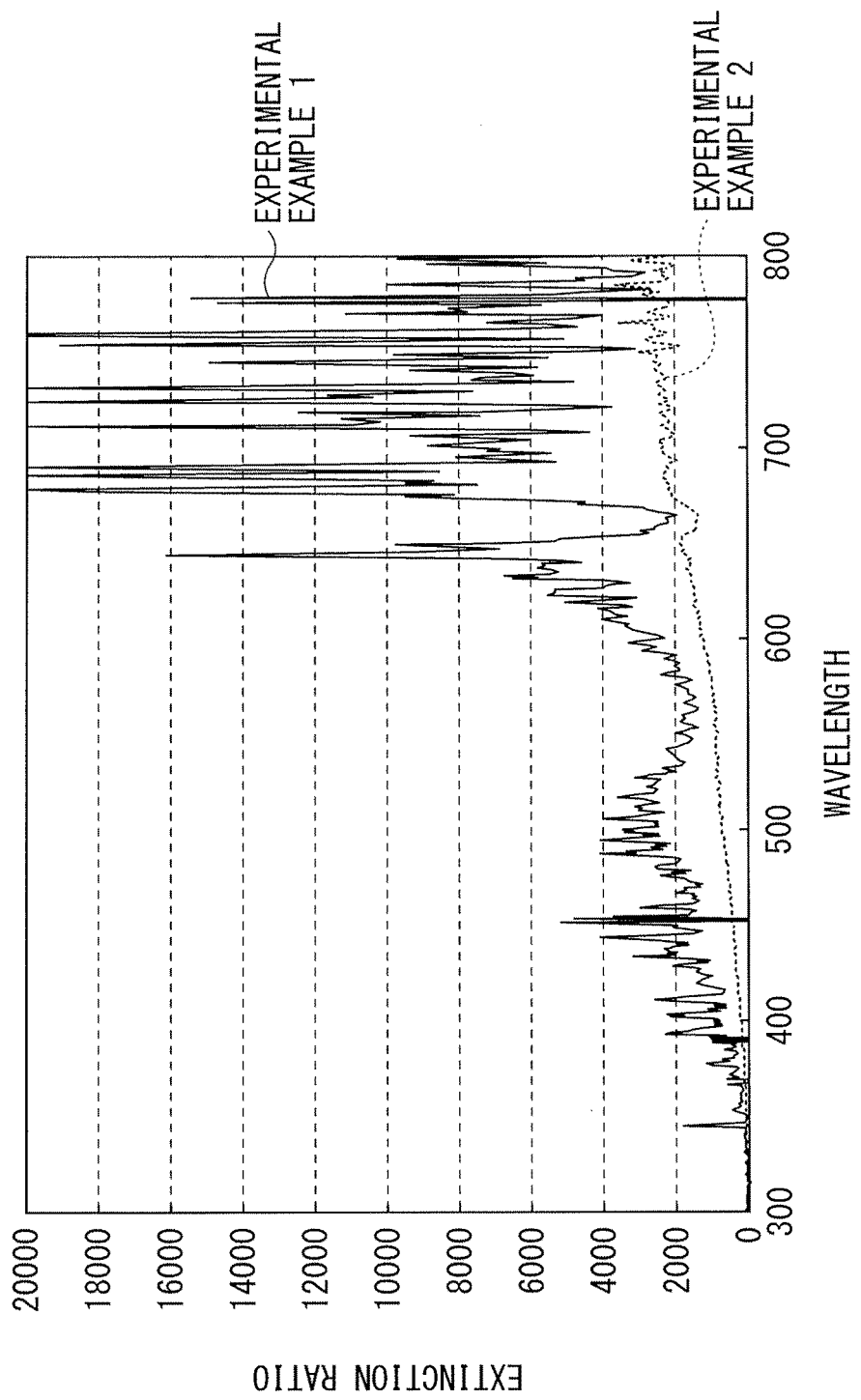

ETCHING PROCESS, METHOD OF MANUFACTURING ELECTRONIC DEVICE, AND METHOD OF MANUFACTURING POLARIZING PLATE

CROSS REFERENCE TO RELATED APPLICATIONS

This application claims the benefit of Japanese Priority Patent Application JP 2013-176347 filed Aug. 28, 2013, the entire contents of which are incorporated herein by reference.

BACKGROUND

The present technology relates to an etching process using dry etching, a method of manufacturing an electronic device using the etching process, and a method of manufacturing a polarizing plate using the etching process.

In a manufacturing process of an electronic device such as a display unit and an image pickup device, a metal film is patterned to form a wiring pattern. For example, the wiring pattern may be formed as follows. First, a metal film is formed on an entire surface of a substrate, and then a resist film pattern is formed on the metal film using a photolithography technique. Subsequently, the metal film is dry-etched using the resist film as a mask. Subsequently, the resist film is removed to produce a desired wiring pattern. In such a formation method of the wiring pattern, the surface of the metal film is covered by a mask, and the metal film exposed from the mask is scraped in a direction perpendicular to a substrate surface. However, a sidewall of the wiring pattern is exposed to an etching gas atmosphere during the etching. This may easily cause occurrence of so-called side etching in which the sidewall is excessively etched in a horizontal direction with respect to the substrate surface. In particular, a sidewall of a wiring pattern of a corrosion-prone aluminum material may be greatly scraped.

A carbon inclusion generated from the resist film is used as a protective material so that such side etching is suppressed. In a dry etching step using high-density plasma, a carbon inclusion generated from a polymer configuring the resist film is decomposed in the plasma, and adheres to the sidewall of the wiring pattern. Such a carbon inclusion acts as a protective material, so that it is possible to prevent side etching (for example, see Japanese Unexamined Patent Application Publication No. 2009-188224).

SUMMARY

However, when thickness of the resist film is increased with respect to a wiring pattern having a small line width, the resist film becomes unstable, and may fall down. Hence, if a wiring pattern is made finer, a resist film becomes thinner, so that a protective material in an amount sufficient for preventing side etching is less likely to be generated.

It is desirable to provide an etching process that allows side etching to be suppressed even if a metal film is formed into a fine pattern, a method of manufacturing an electronic device using the etching process, and a method of manufacturing a polarizing plate using the etching process.

According to an embodiment of the present technology, there is provided an etching process, including: forming a metal film on a substrate having a pattern formation region; forming a mask having a predetermined pattern on the metal film in the pattern formation region, and forming a resist film in part or all of a periphery of the pattern formation region; and dry-etching the metal film in the pattern formation region.

According to an embodiment of the present technology, there is provided a method of manufacturing an electronic device, including: forming a metal film on a substrate having a wiring formation region; forming a mask having a predetermined pattern on the metal film in the wiring formation region, and forming a resist film in part or all of a periphery of the wiring formation region; and dry-etching the metal film in the wiring formation region to form a wiring pattern.

According to an embodiment of the present technology, there is provided a method of manufacturing a polarizing plate, including: forming a metal film on a substrate having a light entrance region; forming a mask having a predetermined pattern on the metal film in the light entrance region, and forming a resist film in part or all of a periphery of the light entrance region; and dry-etching the metal film in the light entrance region to form a polarization pattern.

In the etching process, the method of manufacturing the electronic device, or the method of manufacturing the polarizing plate according to the above-described embodiment of the present technology, since the resist film is provided in the periphery of the pattern formation region, a carbon inclusion is generated from the resist film, and the metal film pattern is covered by the carbon inclusion.

According to the etching process, the method of manufacturing the electronic device, and the method of manufacturing the polarizing plate of the above-described respective embodiments of the present technology, since the resist film is provided in the periphery of the pattern formation region, it is possible to protect the sidewall of the metal film pattern by the carbon inclusion generated from the peripheral resist film. Consequently, even if a fine pattern is provided in the pattern formation region, a sufficient amount of protective material is easily provided, and it is possible to suppress side etching. It is to be noted that the effect described herein is not necessarily limitative, and any of other effects described in this disclosure may be shown.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIG. 20 is a diagram illustrating an extinction ratio of a polarizing plate formed using each of the processes illustrated in FIG. 12A and FIG. 9B.

DETAILED DESCRIPTION

Hereinafter, some embodiments of the present technology will be described in detail with reference to the accompanying drawings. It is to be noted that description is made in the following order.

1. First embodiment (etching process: an example of using a hard mask).
2. Modification 1 (an example of using a resist mask).
3. Second embodiment (etching process: an example where a pattern formation region is provided in each of some unit regions, and a resist supply region is provided in each of other unit regions).
4. Modification 2 (an example where a resist supply region is further provided in a unit region in which a pattern formation region is provided).
5. Third embodiment (etching process: an example where a resist supply region is provided around unit regions in a central portion).
6. Modification 3 (an example where a resist supply region is further provided in a unit region in which a pattern formation region is provided).

<First Embodiment>

Figure 1:
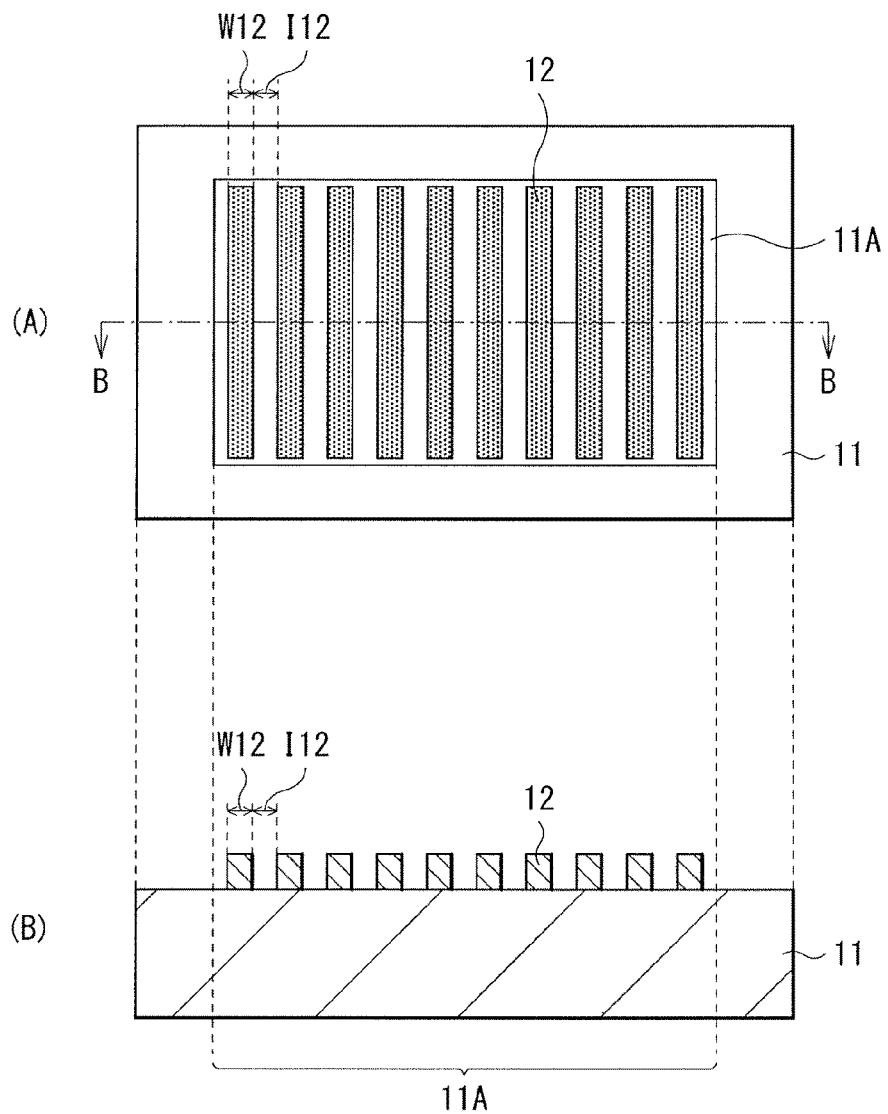
FIG. 1 is a diagram illustrating an example of a configuration of wiring formed by an etching process according to a first embodiment of the present technology.

In FIG. 1, (A) illustrates a planar configuration of a pattern of a wiring 12 formed using an etching process according to a first embodiment of the present technology, and (B) illustrates a sectional configuration along a line B-B in (A). The wiring 12 may be provided in a pattern formation region 11A in a central portion of a surface of a substrate 11 with, for example, a line width W12 of 75 nm and a line interval I12 of 75 nm between lines adjacent to each other of the wiring 12. For example, the wiring 12 may be used as a wiring of an electronic device such as a display unit and an image pickup device. For example, the pattern formation region 11A may correspond to a region (pixel section), in which a plurality of pixels are disposed, of a display unit, an image pickup device, or the like.

Figure 2:
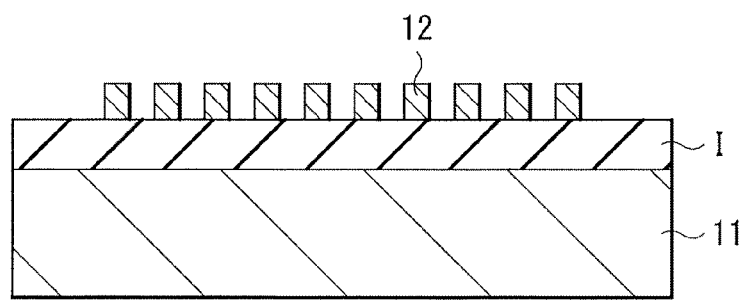
FIG. 2 is a sectional diagram in the case where an insulating film is provided on a substrate illustrated in FIG. 1.
Figure 3:
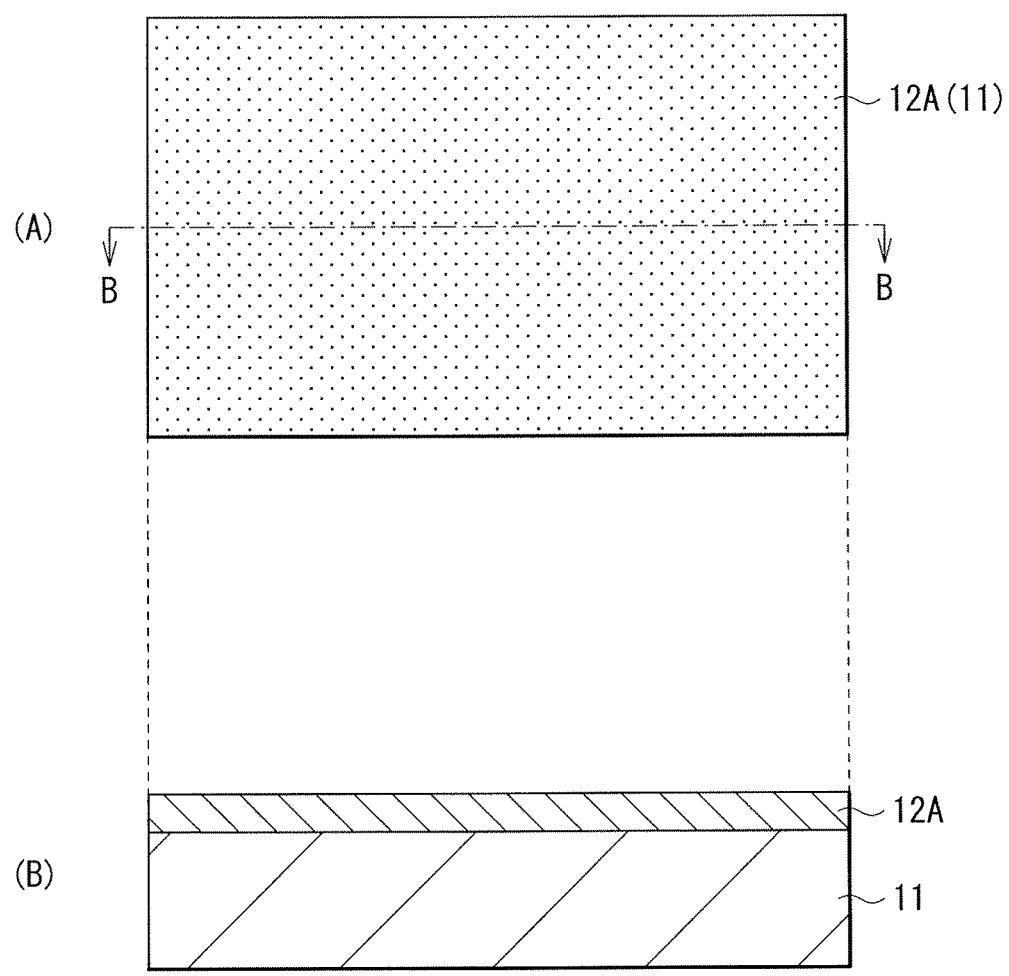
FIG. 3 is a diagram illustrating one step of a formation process of the wiring illustrated in FIG. 1.

As illustrated in FIG. 2, an insulating film I may be provided between the wiring 12 and the substrate 11. For example, a silicon oxide ($SiO_2$) film, etc. may be used for the insulating film I. For example, the substrate 11 may be configured of a plate member such as a quartz plate, a glass plate, a silicon plate, a plastic film, or the like. The constituent material of the substrate 11 may be selected in accordance with a type of a device to be manufactured using this etching process. The wiring 12 may be configured of a metal material such as aluminum (Al), titanium (Ti), tantalum (Ta), tungsten (W), and the like. The wiring 12 may each have a stacked structure including, for example, aluminum, titanium (Ti), and titanium nitride (TiN) stacked in this order (Ti/TiN/Al). Alternatively, tungsten silicide (WSi) may be stacked on aluminum to configure WSi/Al wiring 12.

For example, such a pattern of the wiring 12 may be formed by the following etching process (FIGS. 3 to 8). In the following description with FIGS. 3, 4, and 6 to 8, (A) of each of FIGS. 3, 4, 6, 7, and 8 corresponds to the planar configuration of (A) of FIG. 1, and (B) of each of FIGS. 3, 4, 6, 7, and 8 illustrates a sectional configuration along a line B-B in (A) of each of FIGS. 3, 4, 6, 7, and 8.

First, an insulating film (the insulating film I in FIG. 2) is provided over the entire surface of the substrate 11. Subsequently, a metal film 12A including, for example, aluminum is formed on the insulating film by a physical vapor deposition (PVD) process such as a sputtering process ((A) and (B) of FIG. 3). Subsequently, as illustrated in (A) and (B) of FIG. 4, a hard mask 13 having a predetermined pattern is provided in the pattern formation region 11A of the substrate 11, and a resist film 14 is provided so as to circumferentially enclose the pattern formation region 11A (a resist supply region 11B). As will be described in detail later, in the first embodiment, such a resist supply region 11B is provided, thereby even if the wiring 12 has a fine pattern, a desired amount of protective material (a sidewall protective film 14P in FIG. 5 described later) is generated, and therefore it is possible to suppress side etching of the wiring 12. For example, the resist supply region 11B may be a portion corresponding to a portion outside a pixel section of a display unit, an image pickup device, or the like.

For example, the hard mask 13 and the resist supply region 11B may be formed as follows. First, for example, a silicon oxide film may be formed on the entire surface of the substrate 11, and then the silicon oxide film may be processed with lithography and dry etching to form the hard mask 13 in the pattern formation region 11A. For example, the silicon oxide film may be patterned using a mask formed by patterning an undepicted resist film. Subsequently, for example, the resist film 14 may be formed in the periphery of the pattern formation region 11A using a photolithography technique. Consequently, the resist supply region 11B may be formed. For example, a photosensitive polymer material may be used for the resist film 14. For example, not only the silicon oxide film but also a silicon nitride (SiN) film may be used for the hard mask 13. For example, respective values of a line width W13 and a line interval I13 of the hard mask 13 may be set to the same as respective values of the line width W12 and the line interval I12 of the wiring 12 (FIG. 1) to be intended to be formed. The line width W13 of the hard mask 13 may be larger than the line width W12 of the wiring 12. This makes it possible to suppress side etching of the wiring 12.

After the hard mask 13 and the resist film 14 are provided, the metal film 12A is dry-etched using the hard mask 13. For example, the dry etching may be performed with the etching gas ionized or radicalized by plasma. For example, a chlorine-based gas such as $Cl_2$ or $BCl_3$ may be used as the etching gas. A hydrocarbon-based gas such as methane may be used as the etching gas. During such dry etching, the polymer material configuring the resist film 14 is decomposed, and a carbon inclusion is generated. In the case of using the hydrocarbon-based gas as the etching gas, a carbon inclusion is also generated from the etching gas.

Figure 5:
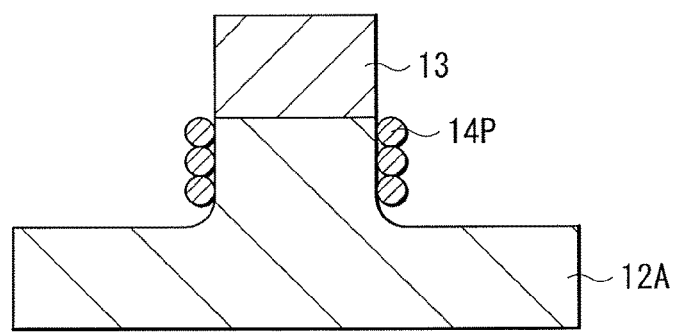
FIG. 5 is a sectional diagram illustrating a step following FIG. 4.

As illustrated in FIG. 5, such a carbon inclusion adheres to the metal film 12A during the etching, and is formed as the sidewall protective film 14P that prevents excessive etching in a horizontal direction with respect to a surface of the substrate 11. Specifically, while a side face in a thickness direction of the metal film 12A is exposed from the hard mask 13, since the side face is covered by the sidewall protective film 14P, side etching of the wiring 12 (metal film 12A) is suppressed. The insulating film I (FIG. 2) between the substrate 11 and the metal film 12A may serve as, for example, an etching stopper.

Figure 6:
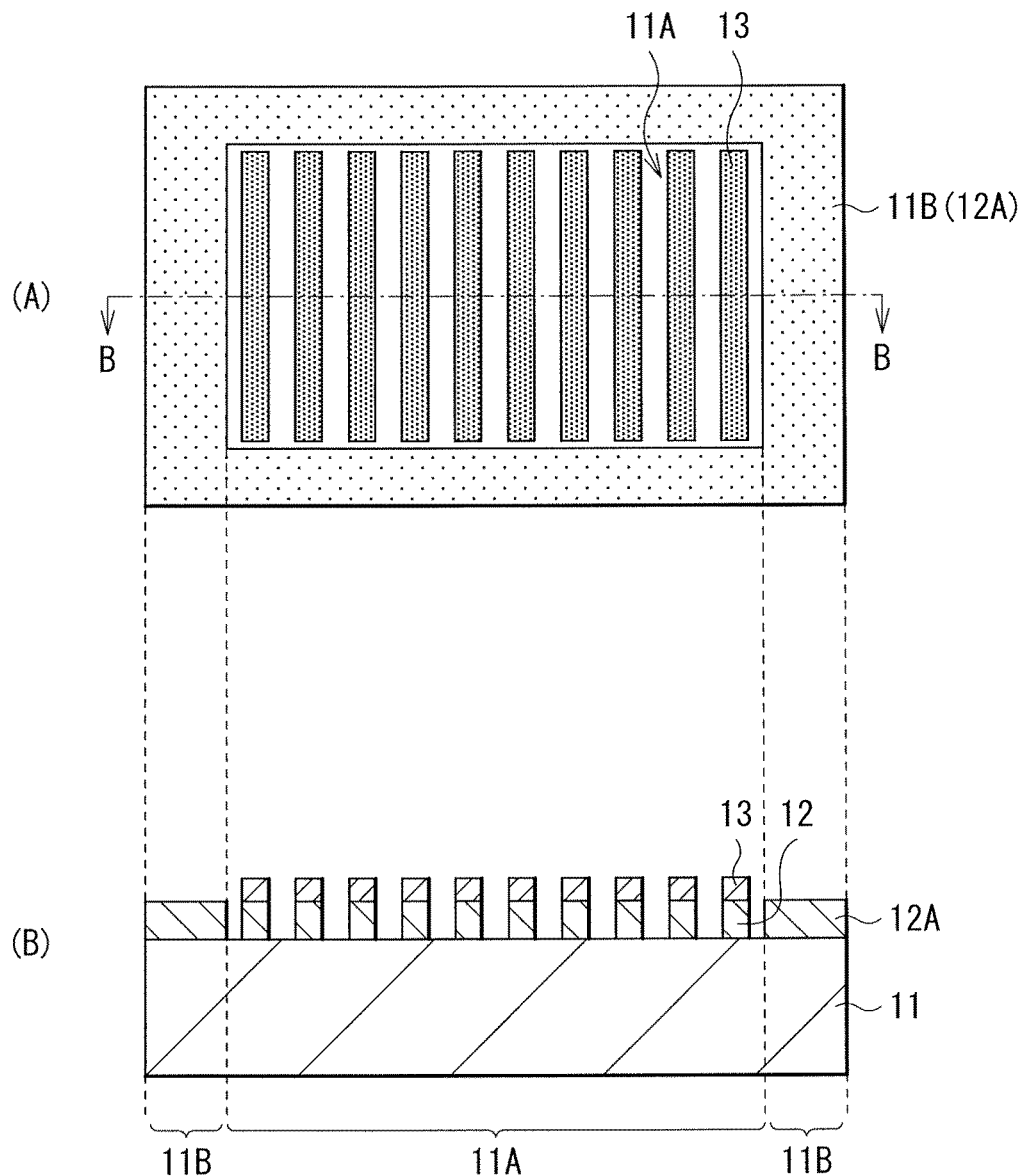
FIG. 6 is a diagram illustrating a step following FIG. 5.
Figure 7:
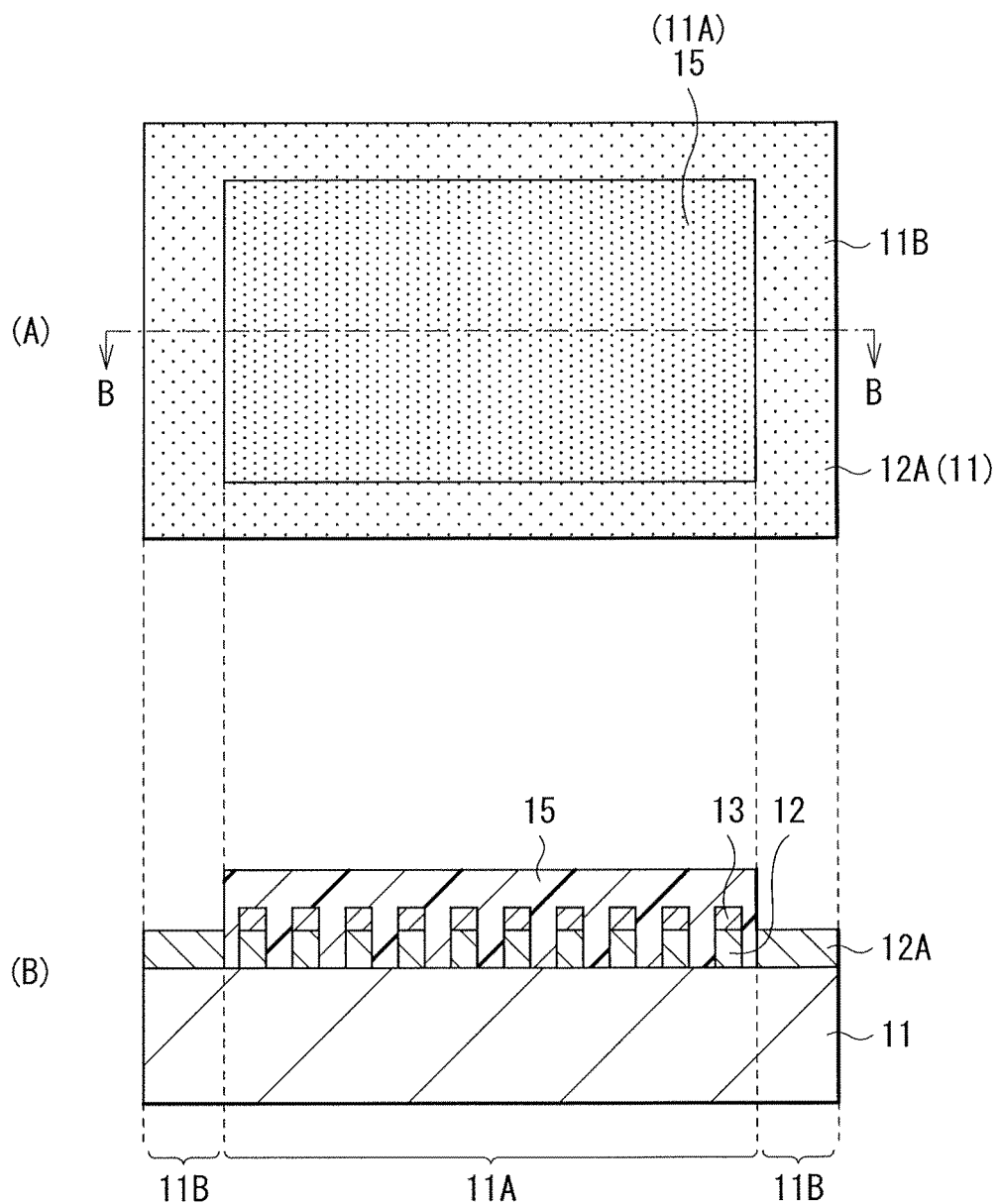
FIG. 7 is a diagram illustrating a step following FIG. 6.
Figure 8:
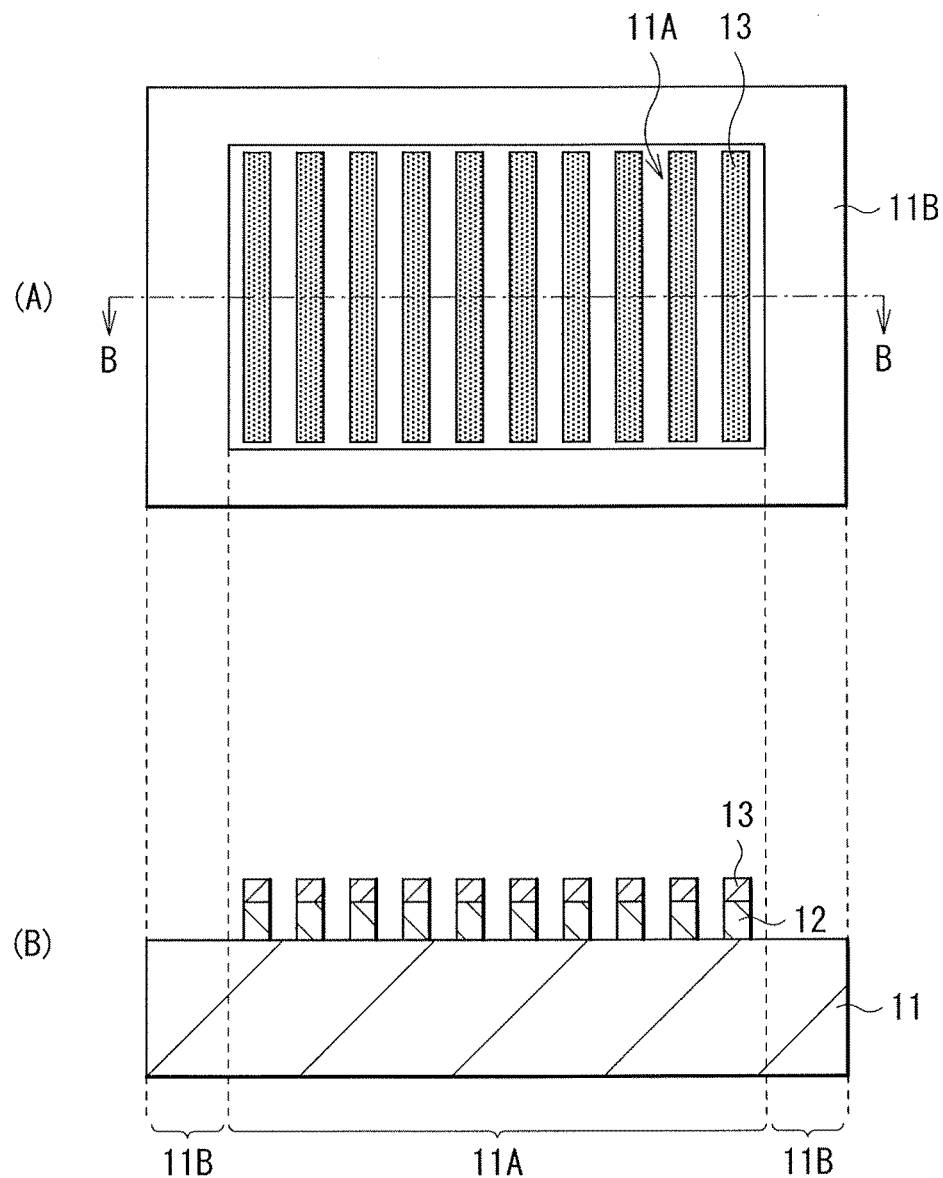
FIG. 8 is a diagram illustrating a step following FIG. 7.

In this way, the metal film 12A is processed by dry etching, so that the metal film 12A is removed except for a portion covered with the hard mask 13, and the wiring 12 having the same pattern as that of the hard mask 13 is formed in the pattern formation region 11A (FIG. 6). Subsequently, the metal film 12A left in the resist supply region 11B is removed. Specifically, as illustrated in FIG. 7, the pattern formation region 11A is covered by a mask 15 configured of, for example, a resist film, and then the metal film 12A exposed form the mask 15 is removed by etching (FIG. 8). Each of dry etching and wet etching may be used as the etching. In the case where the metal film 12A in the resist supply region 11B does not affect the wiring 12, other components, and the like, the metal film 12A may be left without being removed. Finally, the hard mask 13 is removed as necessary, so that the wiring 12 as illustrated in FIG. 1 is completed.

In this way, in the etching process of the first embodiment, the resist film 14 is provided in the periphery of the pattern formation region 11A to form the resist supply region 11B. Consequently, it is possible to prevent side etching during dry etching of the metal film 12A. This will be described below.

Figure 9A:
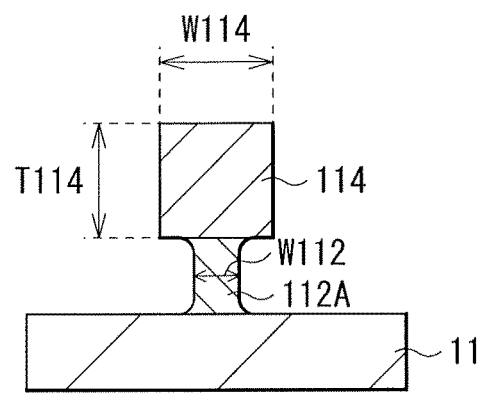
FIG. 9A is a sectional diagram illustrating one step of an etching process according to a comparative example.

FIG. 9A illustrates a sectional configuration of one step of an etching process according to a comparative example. In this etching process, dry etching of a metal film 112A is performed without providing the resist supply region. A mask 114 having a predetermined pattern configured of a resist film is provided on the metal film 112A, and a pattern of the metal film 112A is formed in correspondence to a shape of the mask 114. For example, a line width W114 of the mask 114 is 100 nm. To form such a fine pattern, for example, exposure using KrF (248 nm), ArF (198 nm), or the like may be performed. The mask 114 used for such an exposure step has a small thickness T114. For example, the mask 114 having a thickness T114 of 300 nm to 500 nm both inclusive may be used for KrF, and the mask 114 having a thickness T114 of 200 nm to 300 nm both inclusive may be used for ArF. A sufficient amount of sidewall protective film (the sidewall protective film 14P in FIG. 5) is not allowed to be supplied from such a thin mask 114, and side etching of the metal film 112A proceeds. Hence, a line width W112 of wiring formed from the metal film 112A is not constant along a thickness direction of the wiring, resulting in formation of a portion narrower than a line width W114 of the mask 114 (W114>W112). In particular, when the metal film 112A is configured of a corrosion-prone material such as, for example, aluminum, side etching may easily occur.

When the metal film 112A has a large thickness, etching selectivity may be difficult to be secured only by the mask 114 configured of the resist film. When the metal film 112A has a stacked structure, a similar problem may occur.

Figure 9B:
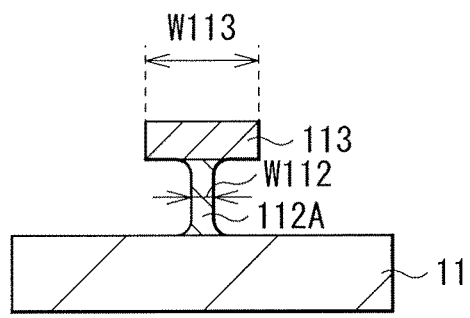
FIG. 9B is a sectional diagram illustrating another example of the one step of the etching process illustrated in FIG. 9A.

In such a case, as illustrated in FIG. 9B, a hard mask 113 configured of, for example, a silicon oxide film may be used. In etching using the hard mask 113, first, a silicon oxide film is formed on the metal film 112A, and then an undepicted resist film having a predetermined pattern is formed on the silicon oxide film. Subsequently, the resist film is patterned to form a mask, and then the silicon oxide film is processed by dry etching using the mask. Consequently, the hard mask 113 is formed. Subsequently, the metal film 112A is processed by dry etching using the hard mask 113. In this dry etching, while a carbon inclusion is generated from the resist film used for forming the hard mask 113, an amount of resist is small and therefore side etching easily proceeds compared with the process illustrated in FIG. 9A. Consequently, a line width W112 of wiring formed from the metal film 112A may be significantly different from a line width W113 of the hard mask 113 (W113>>W112).

In contrast, in the etching process of the first embodiment, since the resist supply region 11B is provided in the periphery of the pattern formation region 11A, even if the amount of the resist existing in the pattern formation region 11A is limited, the sidewall protective film 14P (FIG. 5) is allowed to be complementarily supplied from the resist supply region 11B. Consequently, even if the line width W12 of the wiring 12 is small, it is possible to prevent side etching of the wiring 12. Specifically, it is possible to make a sectional shape of each line of the wiring 12 to be close to a rectangular shape while the line width W12 of the wiring 12 is constant in a thickness direction. Consequently, it is possible to improve properties of an electronic device, a polarizing plate, or the like formed using this etching process.

Moreover, since the hard mask 13 is allowed to be used in the pattern formation region 11A, it is possible to prevent side etching of the wiring 12 while etching selectivity is secured.

Furthermore, since the resist supply region 11B is provided outside the pattern formation region 11A, the resist film 14 may not affect the pattern of the wiring 12 (metal film 12A).

In this way, in the first embodiment, since the resist film 14 is disposed around the pattern formation region 11A, the sidewall protective film 14P is allowed to be generated from the resist film 14 during the dry etching step of the metal film 12A. Consequently, even if the wiring 12 has a fine pattern, it is possible to supply a sufficient amount of sidewall protective film 14P, and suppress side etching of the wiring 12.

Although a modification of the first embodiment and other embodiments are now described, the same constitutional portions as those in the first embodiment are designated by the same numerals in the following description, and description of them is appropriately omitted.

<Modification 1>

Figure 4:
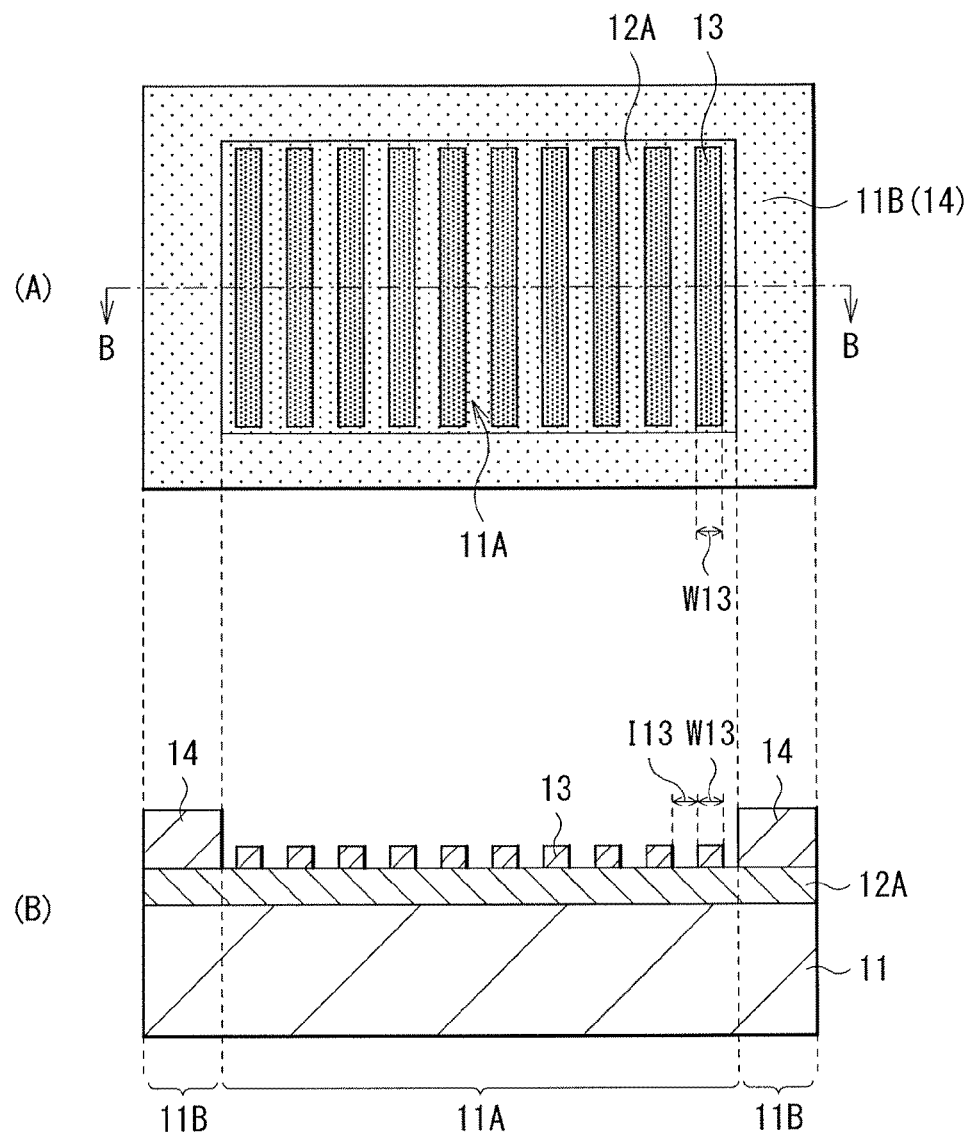
FIG. 4 is a diagram illustrating a step following FIG. 3.
Figure 10:
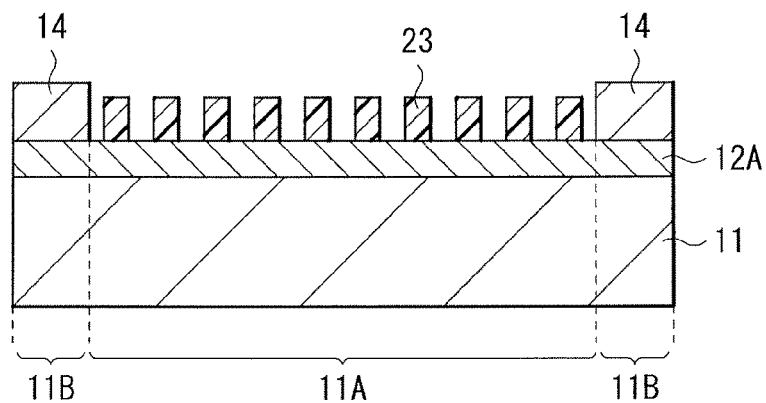
FIG. 10 is a sectional diagram illustrating one step of an etching process according to Modification 1.
Figure 11A:
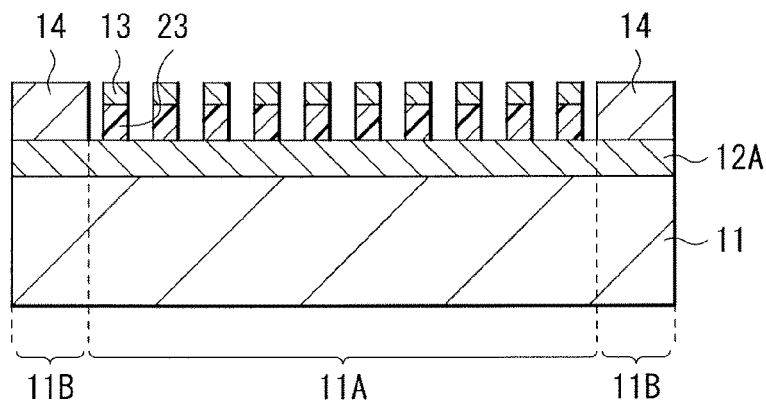
FIG. 11A is a sectional diagram illustrating another example of the one step of the etching process illustrated in FIG. 10.
Figure 11B:
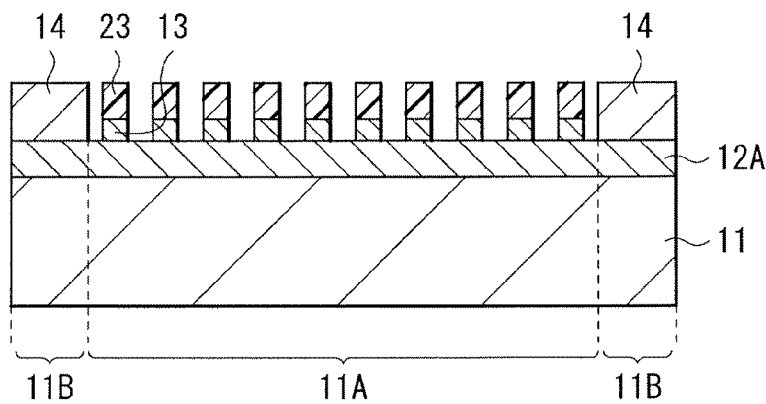
FIG. 11B is a sectional diagram illustrating still another example of the one step of the etching process illustrated in FIG. 10.

As illustrated in FIG. 10, the metal film 12A may be patterned using a resist mask 23 in place of the hard mask (the hard mask 13 in FIG. 4). Alternatively, as illustrated in FIGS. 11A and 11B, the hard mask 13 and the resist mask 23 may be used together. The resist mask 23 and the hard mask 13 may be formed in this order on the substrate 11 (FIG. 11A), or the hard mask 13 and the resist mask 23 may be formed in this order on the substrate 11 (FIG. 11B).

<Second Embodiment>

Figure 12A:
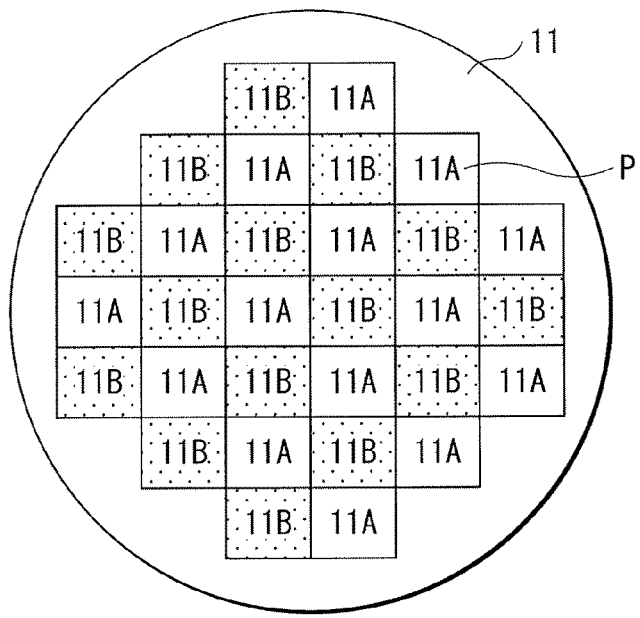
FIG. 12A is a plan diagram illustrating one step of an etching process according to a second embodiment of the present technology.

FIG. 12A illustrates, in a plan view, one step of an etching process according to a second embodiment of the present technology. In this etching process, the pattern formation region 11A is formed in each of some unit regions P out of a plurality of unit regions P on the substrate 11, and the resist supply region 11B is formed in each of other unit regions P. Except for this, this etching process is performed in the same way as in the first embodiment, and the functions and the effects of the etching process are similar to those in the first embodiment.

For example, each of the unit regions P may be a region corresponding to one panel of a display unit or one chip of a semiconductor device. A plurality of pattern formation regions 11A may be provided for the individual unit regions P on the substrate 11. It is to be noted that FIG. 1 illustrates a portion corresponding to one unit region P. For example, the unit regions P for the pattern formation regions 11A and the unit regions P for the resist supply regions 11B may be alternately disposed (FIG. 12A). The pattern formation regions 11A and the resist supply regions 11B may be arranged in any configuration. For example, the number of the unit regions P for the resist supply regions 11B may be adjusted in accordance with the amount of sidewall protective film 14P (FIG. 5) necessary for uniformly etching a wafer surface.

Figure 12B:
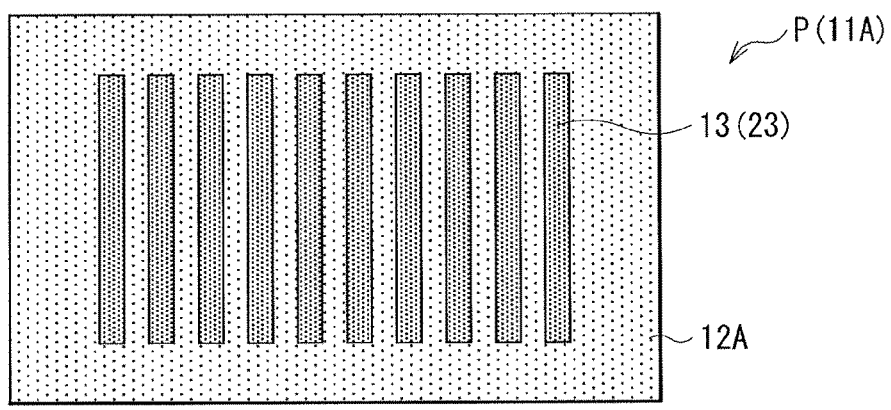
FIG. 12B is a plan diagram illustrating a configuration of a pattern formation region illustrated in FIG. 12A.

FIG. 12B illustrates a planar configuration of the unit region P in which the pattern formation region 11A is provided. Thus, in this unit region P, the hard mask 13 is provided on the metal film 12A to perform dry etching of the metal film 12A. Any of the unit regions P around the unit region P, in which the pattern formation 11A region is provided, is formed to be the resist supply region 11B. All the unit regions P around that unit region P, in which the pattern formation region 11A is provided, may each be the resist supply region 11B.

Figure 12C:
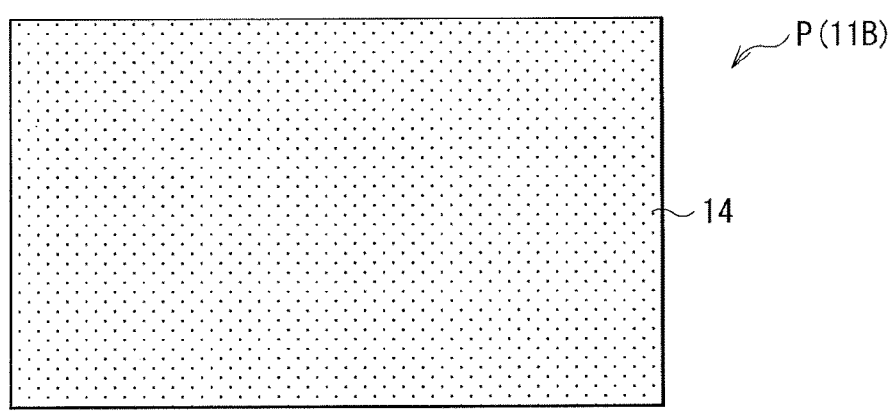
FIG. 12C is a plan diagram illustrating a configuration of a resist supply region illustrated in FIG. 12A.

FIG. 12C illustrates a planar configuration of the unit region P formed as the resist supply region 11B. In the unit region P, the resist film 14 is provided over the entire surface. Specifically, there is provided the resist film 14 having the same planar shape and the same area as those of the pattern formation region 11A illustrated in FIG. 12B. It is therefore possible to supply a larger amount of the sidewall protective film 14P during dry etching of the metal film 12A than in the case of providing the resist supply region 11B together with the pattern formation region 11A in one unit region P (for example, FIG. 4). Consequently, it is possible to securely prevent side etching of the wiring 12 compared with the etching process of the first embodiment. Moreover, since the resist supply region 11B is formed separately from the unit region P in which the pattern formation region 11A is provided, even if the metal film 12A remains in the resist supply region 11B, the pattern formation region 11A may not be affected thereby. Consequently, it is unnecessary to perform a step of removing the metal film 12A in the resist supply region 11B after patterning of the metal film 12A in the pattern formation region 11A.

<Modification 2>

Figure 13:
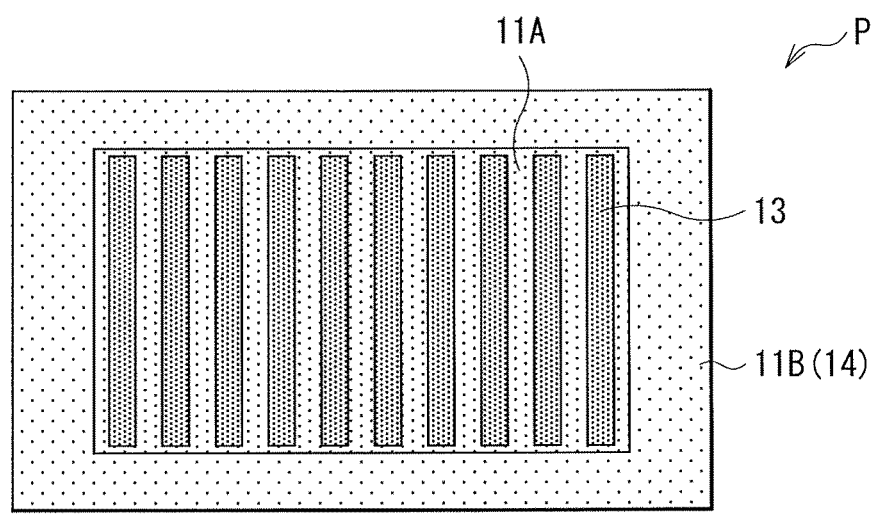
FIG. 13 is a plan diagram illustrating one step of an etching process according to Modification 2.

As illustrated in FIG. 13, the resist supply region 11B (resist film 14) may be further provided in the unit region P in which the pattern formation region 11A is provided. In this unit region P, for example, as described in the first embodiment, the pattern formation region 11A is provided in a central portion, and the resist supply region 11B is provided in the periphery of the pattern formation region 11A. This makes it possible to further supply the sidewall protective film 14P at a position closer to the pattern formation region 11A in addition to supply from the resist supply region 11B (FIG. 12C) including the resist film 14 provided on the entire surface of the unit region P so that side etching is prevented.

<Third Embodiment>

Figure 14A:
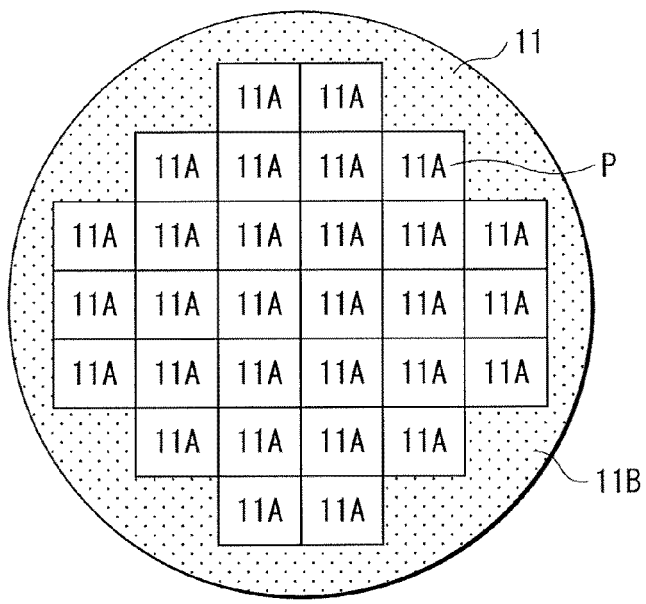
FIG. 14A is a plan diagram illustrating one step of an etching process according to a third embodiment of the present technology.

FIG. 14A illustrates, in a plan view, one step of an etching process according to a third embodiment of the present technology. In this etching process, a plurality of unit regions P, in each of which the pattern formation region 11A is provided, are provided in a central portion of the substrate 11, and the resist supply region 11B is provided outside the plurality of unit regions P. Except for this, this etching process is performed in the same way as in the first embodiment, and the functions and the effects of the etching process are similar to those in the first embodiment.

Figure 14B:
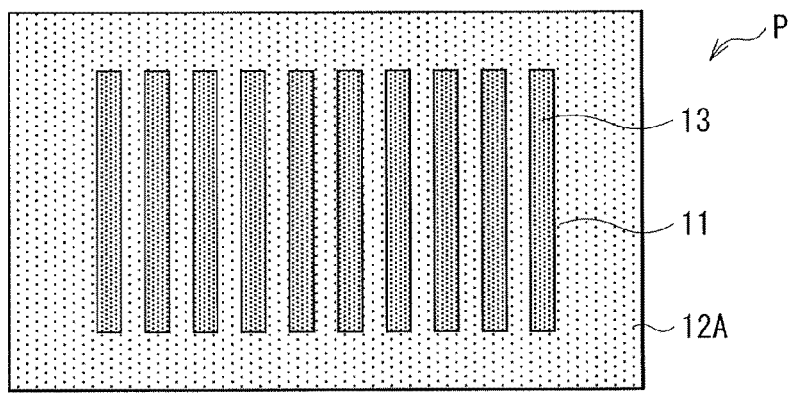
FIG. 14B is a plan diagram illustrating a configuration of a pattern formation region illustrated in FIG. 14A.

FIG. 14B illustrates a planar configuration of the unit region P in which the pattern formation region 11A is provided. In this unit region P, the hard mask 13 is provided on the metal film 12A to perform dry etching of the metal film 12A. Such a pattern formation region 11A is provided in all of the unit regions P on the substrate 11.

The resist supply region 11B (resist film 14) is formed so as to enclose the plurality of unit regions P as a whole. While dry etching of the metal film 12A is performed, the sidewall protective film 14P (FIG. 5) is generated from the resist supply region 11B. Consequently, side etching of the wiring 12 is suppressed. Moreover, as in the second embodiment, the resist supply region 11B is provided outside the unit regions P in each of which the pattern formation region 11A is provided. Hence, it is unnecessary to perform a step of removing the metal film 12A in the resist supply region 11B.

<Modification 3>

Figure 15:
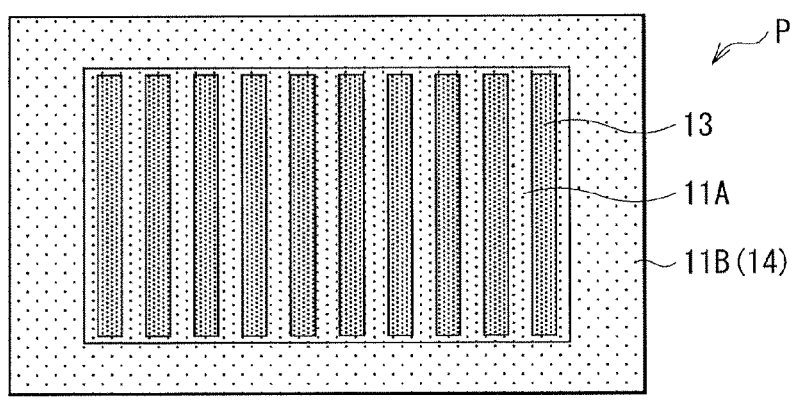
FIG. 15 is a plan diagram illustrating one step of an etching process according to Modification 3.

As illustrated in FIG. 15, the resist supply region 11B (resist film 14) may be further provided in the unit region P in which the pattern formation region 11A is provided. In this unit region P, for example, as described in the first embodiment, the pattern formation region 11A may be provided in a central portion, and the resist supply region 11B may be provided in the periphery of the pattern formation region 11A. This makes it possible to further supply the sidewall protective film 14P at a position closer to the pattern formation region 11A in addition to supply from the resist supply region 11B (FIG. 14A) outside the unit region P so that side etching is prevented.

<Application Examples>

The etching process according to an embodiment of the present technology is applicable for manufacturing of a wiring substrate such as, for example, a thin film transistor (TFT) substrate and a complementary metal oxide semiconductor (CMOS) substrate. In a wiring region (pattern formation region) of the wiring substrate, a wiring pattern may be formed by, for example, the etching process according to an embodiment of the present technology. The wiring substrate may be used to manufacture an electronic device such as, for example, a display unit and an image pickup device. In addition, the etching process according to an embodiment of the present technology may be used for, for example, formation of a polarization pattern of a polarizing plate.

Figure 16:
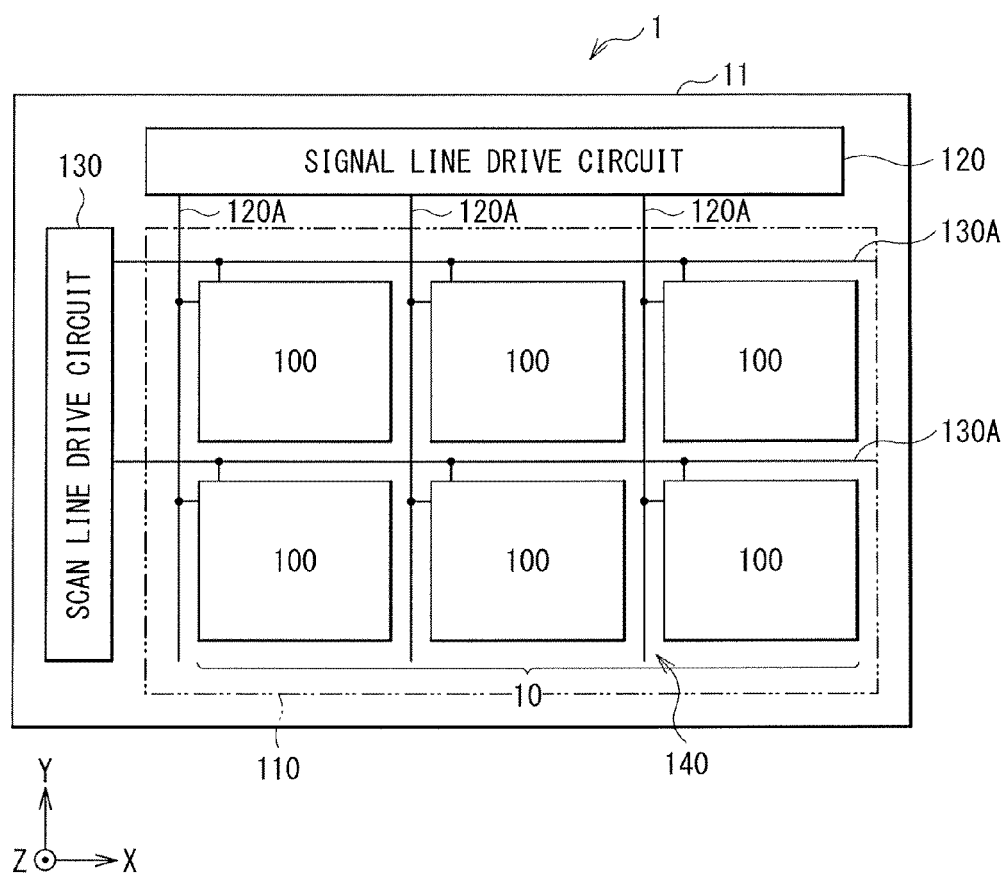
FIG. 16 is a diagram schematically illustrating a configuration of a display unit according to application example 1.

FIG. 16 illustrates an example of overall configuration of a display unit (display unit 1) manufactured using the etching process according to an embodiment of the present technology. The display unit 1 may include a display layer such as, for example, a liquid crystal layer or an organic electroluminescence (EL) layer between the substrate 11 and an undepicted counter substrate. The display layer is driven for every pixel 100. In a display region 110, the pixels 100 are two-dimensionally disposed in a matrix, and a pixel drive circuit 140 for driving the pixels 100 is provided. In the pixel drive circuit 140, a plurality of signal lines 120A (120A1, 120A2, ..., 120Am, ...) are disposed in a column direction (a Y direction), and a plurality of scan lines 130A (130A1, ..., 130An, ...) are disposed in a row direction (an X direction). One pixel 100 is provided at an intersection of each signal line 120A and each scan line 130A. The signal line 120A has two ends connected to a signal line drive circuit 120. The scan line 130A has two ends connected to a scan line drive circuit 130.

The signal line drive circuit 120 supplies a signal voltage of an image signal corresponding to luminance information supplied from an undepicted signal supply source to a selected pixel 100 through the signal line 120A. The scan line drive circuit 130 is configured of components such as a shift register that sequentially shifts (transfers) a start pulse in synchronization with a received clock pulse. In write of the image signal to each pixel 100, the scan line drive circuit 130 scans the pixels 100 on a row basis to sequentially supply a scan signal to each scan line 130A. The signal line 120A receives a signal voltage from the signal line drive circuit 120, and the scan line 130A receives the scan signal from the scan line drive circuit 130. For example, wiring of such a pixel drive circuit 140 may be formed using the etching process according to an embodiment of the present technology.

Figure 17:
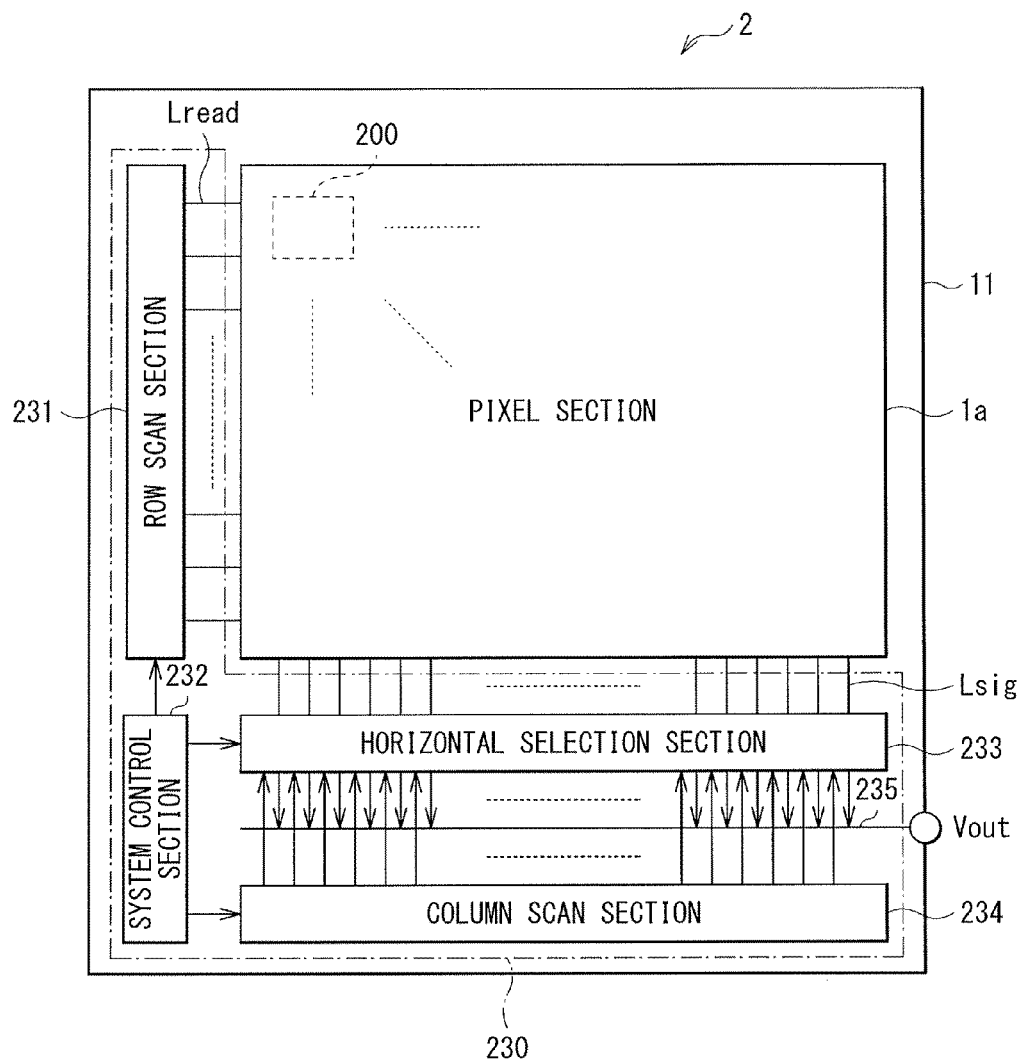
FIG. 17 is a diagram schematically illustrating a configuration of an image pickup device according to application example 2.

FIG. 17 illustrates an overall configuration of a solid image pickup device (an image pickup device 2) manufactured using the etching process according to an embodiment of the present technology. The image pickup device 2 is a CMOS image sensor, and has a pixel section 1a as an imaging area in a central portion of a surface of a semiconductor substrate 11. In a peripheral region of the pixel section 1a, for example, there may be provided a peripheral circuit section 230 including a row scan section 231, a system control section 232, a horizontal selection section 233, and a column scan section 234.

For example, the pixel section 1a may have a plurality of unit pixels 200 that are two-dimensionally arranged in a matrix. In each unit pixel 200, for example, a pixel drive line Lread (specifically, a row selection line and a reset control line) is provided for each pixel row, and a vertical signal line Lsig is provided for each pixel column. The pixel drive line Lread transmits a drive signal for signal read from a pixel, and has one end connected to an output end corresponding to each row of the row scan section 231. For example, wiring of the pixel drive lines Lread, the vertical signal lines Lsig, and the like may be formed using the etching process according to an embodiment of the present technology.

EXAMPLES

Examples of the present technology are now described.

Experimental Example 1

Figure 18:
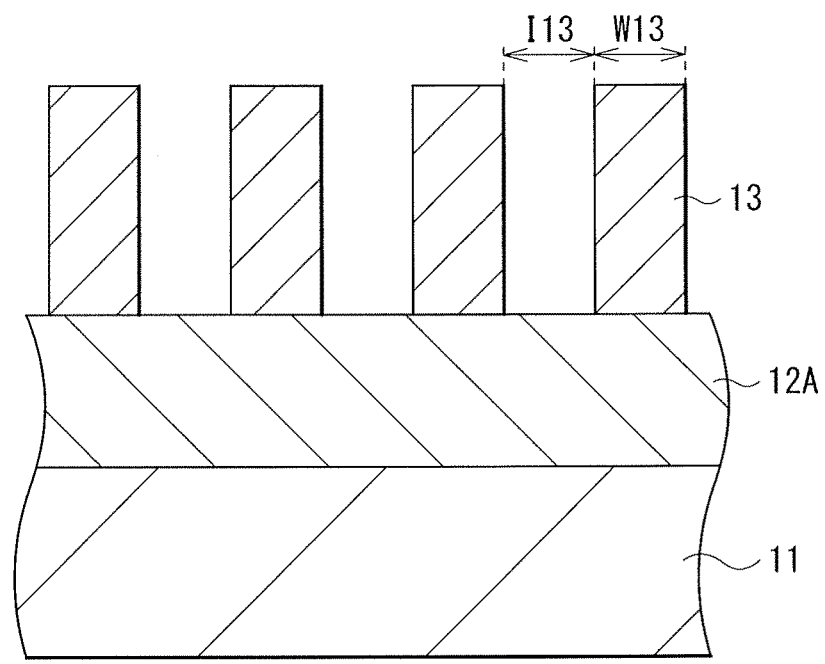
FIG. 18 is a sectional diagram schematically illustrating one step of a method of manufacturing a polarizing plate according to Example.

As described in the second embodiment, a pattern formation region was formed in each of predetermined unit regions, and a resist supply region was formed in each of other unit regions (FIG. 12A), so that a polarizing plate was fabricated. The pattern formation region corresponds to a light entrance region. Specifically, a metal film 12A configured of aluminum was formed on a substrate 11, and then a hard mask 13 was formed in the pattern formation region on the metal film 12A to perform a dry etching process. Glass was used for the substrate 11. A resist film was provided on the entire surface of each of some unit regions around each unit region in which the pattern formation region was formed, so that a resist supply region was formed. The line width W13 of the hard mask 13 in the pattern formation region was 78 nm, and the line interval I13 between lines adjacent to each other of the hard mask 13 was 72 nm (FIG. 18).

Experimental Example 2

A polarizing plate was fabricated in the same way as in the experimental example 1 except that no resist supply region is provided (FIG. 9B). The line width W13 of the hard mask 13 was 73 nm, and the line interval I13 between lines adjacent to each other of the hard mask 13 was 77 nm (FIG. 18).

Figure 19A:
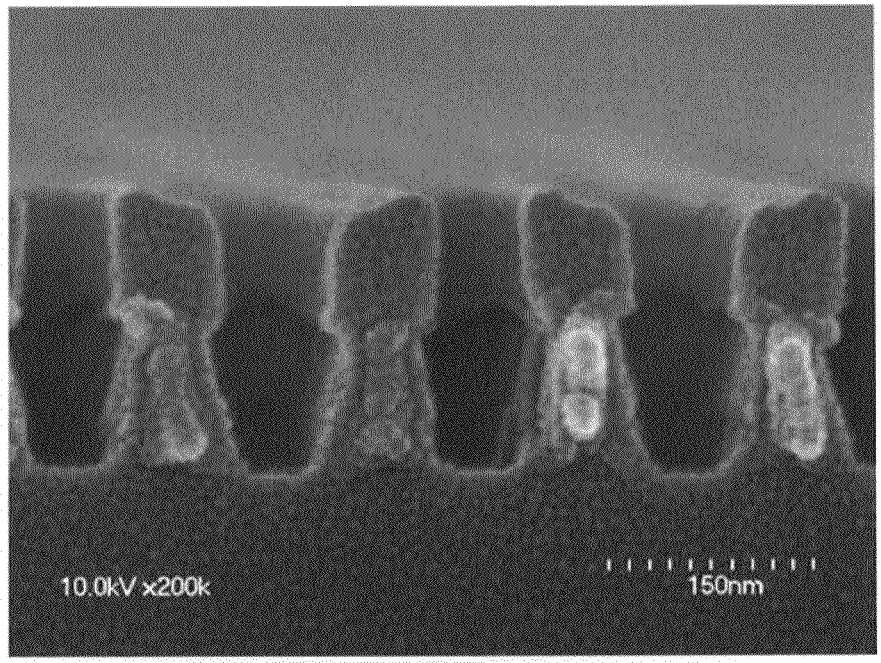
FIG. 19A is a scanning electron microscope (SEM) photograph of wiring formed using the process illustrated in FIG. 12A.
Figure 19B:
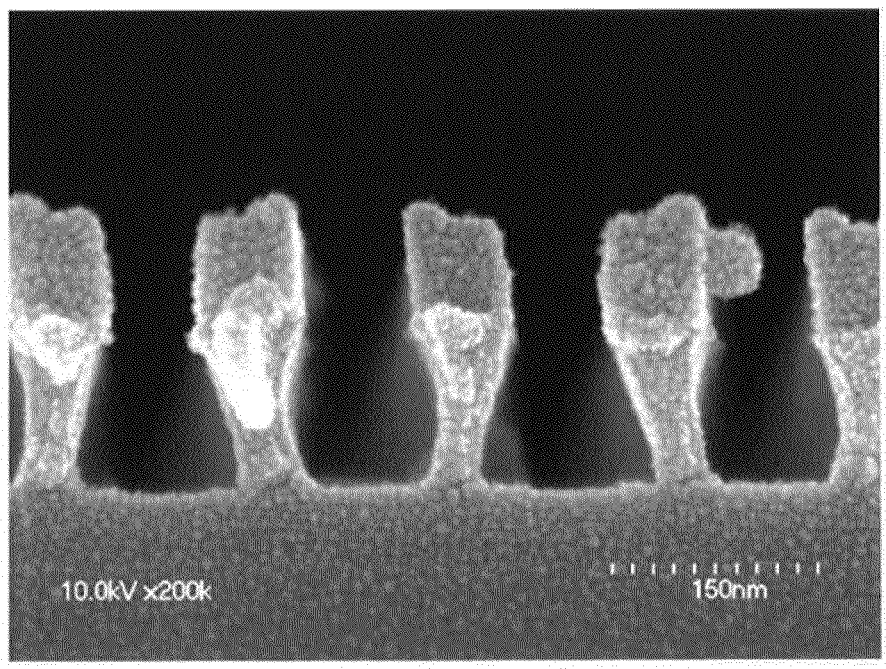
FIG. 19B is an SEM photograph of wiring formed using the process illustrated in FIG. 9B.

FIG. 19A illustrates an SEM photograph of the polarizing plate of the experimental example 1, and FIG. 19B illustrates an SEM photograph of the polarizing plate of the experimental example 2. A line width of the metal film (the wiring 12 in FIG. 1) after the dry etching was 59 nm in the experimental example 1 and 32 nm in the experimental example 2. Specifically, the amount of side etching was 19 nm in the experimental example 1 and 41 nm in the experimental example 2. In this way, it was possible to suppress side etching in the polarizing plate (the experimental example 1) fabricated while the resist supply regions were provided.

FIG. 20 illustrates an extinction ratio of each of the polarizing plates of the experimental examples 1 and 2. The horizontal axis indicates a wavelength, and a vertical axis indicates an extinction ratio. The polarizing plate of the experimental example 1 is extremely improved in extinction ratio compared with the polarizing plate of the experimental example 2. This reveals that it is possible to improve functions of the polarizing plate by accurately patterning the metal film to have a desired width while suppressing side etching.

Although the present technology has been described with the embodiments and the modifications hereinbefore, the technology is not limited thereto, and various modifications or alterations thereof may be made. For example, while the material and the thickness of each layer, and the formation process and the formation condition of each layer have been described in the embodiments and the modifications, these are not limitative. In other words, other materials and thicknesses may be used, or other film formation processes and film formation conditions may be used.

It is to be noted that the effects described in this specification are merely exemplified and not limitative, and other effects may be shown.

It is possible to achieve at least the following configurations from the above-described example embodiments of the disclosure.

(1) An etching process, including:
  forming a metal film on a substrate having a pattern formation region;
  forming a mask having a predetermined pattern on the metal film in the pattern formation region, and forming a resist film in part or all of a periphery of the pattern formation region; and
  dry-etching the metal film in the pattern formation region.
(2) The etching process according to (1), wherein the dry etching is performed to allow a sidewall protective film generated from the resist film to adhere to a surface of the metal film, the surface being exposed from the mask.
(3) The etching process according to (1) or (2), wherein a hard mask is used as the mask.
(4) The etching process according to any one of (1) to (3), wherein the metal film is formed of a material including one of aluminum, titanium, tantalum, and tungsten.
(5) The etching process according to any one of (1) to (4), wherein a stacked film including an aluminum film is formed as the metal film.

(6) The etching process according to (1) or (2), wherein the mask is formed of a resist material.

(7) The etching process according to any one of (1) to (6), wherein the pattern formation region is formed in each of a plurality of unit regions provided on the substrate, and the resist film is formed outside the plurality of unit regions.

(8) The etching process according to (7), further including the resist film in the unit region having the pattern formation region formed therein.

(9) The etching process according to any one of (1) to (8), wherein the pattern formation region is formed in each of some unit regions out of a plurality of unit regions provided on the substrate, and the resist film is formed in each of other unit regions.

(10) The etching process according to (9), further including the resist film in each of the unit regions each having the pattern formation region formed therein.

(11) A method of manufacturing an electronic device, including:
forming a metal film on a substrate having a wiring formation region;
forming a mask having a predetermined pattern on the metal film in the wiring formation region, and forming a resist film in part or all of a periphery of the wiring formation region; and
dry-etching the metal film in the wiring formation region to form a wiring pattern.

(12) A method of manufacturing a polarizing plate, including:
forming a metal film on a substrate having a light entrance region;
forming a mask having a predetermined pattern on the metal film in the light entrance region, and forming a resist film in part or all of a periphery of the light entrance region; and
dry-etching the metal film in the light entrance region to form a polarization pattern.

It should be understood by those skilled in the art that various modifications, combinations, sub-combinations and alterations may occur depending on design requirements and other factors insofar as they are within the scope of the appended claims or the equivalents thereof.

What is claimed is:

1. An etching process, comprising:
forming a metal film on a substrate having a pattern formation region;
forming a mask having a predetermined pattern on the metal film in the pattern formation region, and forming a resist film in part or all of a periphery of the pattern formation region; and
dry-etching the metal film in the pattern formation region,
wherein forming the resist film in part or all of the periphery of the pattern formation region comprises forming the resist film such that the resist film circumferentially encloses the pattern formation region.

2. The etching process according to claim 1, wherein the dry etching is performed to allow a sidewall protective film generated from the resist film to adhere to a surface of the metal film, the surface being exposed from the mask.

3. The etching process according to claim 1, wherein a hard mask is used as the mask.

4. The etching process according to claim 1, wherein the metal film is formed of a material including one of aluminum, titanium, tantalum, and tungsten.

5. The etching process according to claim 1, wherein a stacked film including an aluminum film is formed as the metal film.

6. The etching process according to claim 1, wherein the mask is formed of a resist material.

7. The etching process according to claim 1, wherein the pattern formation region is formed in each portion of a plurality of portions of a surface of the substrate, and
the resist film is formed outside the plurality of portions of the surface of the substrate.

8. The etching process according to claim 7, wherein the resist film is formed in the plurality of portions of the surface of the substrate.

9. The etching process according to claim 1, wherein the pattern formation region is formed in each portion of first portions of a surface of the substrate, and the resist film is formed in each portion of second portions of the surface of the substrate.

10. The etching process according to claim 9, wherein the resist film is formed in the first portions of the surface of the substrate.

11. The etching process according to claim 1, wherein the resist film is a patterned resist film.

12. A method of manufacturing an electronic device, comprising:
forming a metal film on a substrate having a wiring formation region;
forming a mask having a predetermined pattern on the metal film in the wiring formation region, and forming a resist film in part or all of a periphery of the wiring formation region; and
dry-etching the metal film in the wiring formation region to form a wiring pattern,
wherein forming the resist film in part or all of the periphery of the wiring formation region comprises forming the resist film such that the resist film circumferentially encloses the wiring formation region.

13. The method of manufacturing the electronic device according to claim 12, wherein the resist film is a patterned resist film.

14. A method of manufacturing a polarizing plate, comprising:
forming a metal film on a substrate having a light entrance region;
forming a mask having a predetermined pattern on the metal film in the light entrance region, and forming a resist film in part or all of a periphery of the light entrance region; and
dry-etching the metal film in the light entrance region to form a polarization pattern,
wherein forming the resist film in part or all of the periphery of the light entrance region comprises forming the resist film such that the resist film circumferentially encloses the light entrance region.

15. The method of manufacturing the polarizing plate according to claim 14, wherein the resist film is a patterned resist film.

* * * * *